US007929322B2

(12) United States Patent
Llorente Gonzalez et al.

(10) Patent No.: US 7,929,322 B2
(45) Date of Patent: Apr. 19, 2011

(54) VOLTAGE SAG GENERATOR DEVICE

(75) Inventors: Jose Ignacio Llorente Gonzalez, Pamplona (ES); Miguel Linares Fano, Pamplona (ES)

(73) Assignee: Gamesa Innovation & Technology, S.L., Pamplona, Navarra (ES)

( * ) Notice: Subject to any disclaimer, the term of this patent is extended or adjusted under 35 U.S.C. 154(b) by 422 days.

(21) Appl. No.: 11/886,612

(22) PCT Filed: Mar. 28, 2006

(86) PCT No.: PCT/ES2006/000146
§ 371 (c)(1),
(2), (4) Date: Oct. 16, 2008

(87) PCT Pub. No.: WO2006/108890
PCT Pub. Date: Oct. 19, 2006

(65) Prior Publication Data
US 2009/0212748 A1 Aug. 27, 2009

(30) Foreign Application Priority Data

Apr. 15, 2005 (ES) .................................. 200500906

(51) Int. Cl.
*H02J 3/00* (2006.01)
*H02M 5/40* (2006.01)
(52) U.S. Cl. .................... 363/34; 363/56.02; 363/56.03; 363/56.05
(58) Field of Classification Search .................... 363/34, 363/64, 74, 56.02, 56.03, 56.05; 323/215, 323/216, 247; 361/605
See application file for complete search history.

(56) References Cited

U.S. PATENT DOCUMENTS

| 5,920,132 | A | 7/1999 | Rockfield, Jr. et al. | |
|---|---|---|---|---|
| 6,285,169 | B1 | 9/2001 | McEachern | |
| 6,631,075 | B2 * | 10/2003 | Kashima et al. | 361/605 |
| 2004/0027748 | A1 * | 2/2004 | Kojovic et al. | 361/62 |

OTHER PUBLICATIONS

Alpha Technologies, Operator's Manual: BPS Series, BPT Series, Mar. 1995, pp. 15, 17, and 18. Located at <<http://www.alpha.com/Media/documents/tm_cfrbpsbptseries.pdf>> (Last visited Jul. 20, 2010).*
Chung, Y.H., et al. "Voltage Sag and Swell Generator with Thyristor Controlled Reactor." (2000) IEEE, pp. 1933-1937.
Dokic, S.Z., et al. "Computer Simulation of Voltage Sag Generator." 10th International Conference on Harmonics and Quality of Power (2002) IEEE, pp. 649-654.
Chirila, C., et al. "Voltage Sag Equipment for Power Quality Testing." Proceedings Thirty-First Annual North American Power Symposium (1999) California Polytech. State Univ. San Luis Obispo, CA, USA, pp. 448-453.
Collins, E. R., et al. "Generating Unbalanced Voltage Sags with Synchronous Machines." Proceedings of the ICHQP. 7th International Conference on Harmonics and Quality of Power (1996) Univ. Nevada Las Vegas, NV, USA, pp. 265-269.

* cited by examiner

*Primary Examiner* — Bao Q Vu
(74) *Attorney, Agent, or Firm* — Ladas & Parry LLP

(57) ABSTRACT

A voltage sag generator device for use in an electrical generator machine such as a wind turbine, connected to an electrical network including one to three parallel transformers connected on one side to the wind turbine via a coupling switch and circuit breakers, and earthed on the other side via circuit breakers and a control switch. The device includes mechanisms for causing short-circuits when the coupling switch and the control switch are actuated in such a way that a voltage sag having the required duration and type is generated, and mechanisms for protecting the transformers during voltage sag generation.

8 Claims, 2 Drawing Sheets

VOLTAGE SAG GENERATOR DEVICE

FIELD OF THE INVENTION

This invention refers to a device for generating voltage sags on an electrical generator machine and particularly on a wind turbine connected to the internal network of a wind farm.

BACKGROUND OF THE INVENTION

Sudden voltage drops can be caused on the connection to the electrical output network of a park of electric generators such as wind turbines, as a result of short circuits on the network. In such cases, implementing the proper protection disconnects the defective part of the network, producing a new voltage step in the opposite direction and restoring the voltage to the regular level, prior to the defect.

The combination of both steps is known as a "voltage sag" and can be defined by two parameters: both the magnitude and the duration of the voltage step.

A "voltage sag" can cause a wind farm to be disconnected from the network bringing the consequent harmful effects along with it, this therefore requires the correct behaviour of wind turbines in response to voltage sags to be tested.

Discussed below are various known devices for generating voltage sags used for different purposes.

Patent application WO0060430 describes a system for verifying the sensitivity of the components of a glass production plant in response to voltage sags that may occur, comprising a double cascade of industrial autotransformers connected to each phase of the current with at least two bipolar switches, which generates voltage sags on the machine output in proportion to the values of the individual autotransformers located on the cascades. The system provides the option to vary the amplitude and duration of the sag, along with the option to cause different voltage sags for each phase.

Document U.S. Pat. No. 5,886,429 proposes a computer controlled and monitored testing station for testing the response of electronic equipment, connected to said station, to voltage sags and swells generated therein.

Document U.S. Pat. No. 5,920,132 describes a device which is able to generate a reduced voltage by means of an autotransformer on low power industrial equipment, only valid for low voltage.

None of the aforementioned devices can be applied for verifying the behaviour of electrical generator machines such as wind turbines in response to different types of voltage sags. One must consider that in each country there are different standards on this matter, therefore, a wind turbine manufacturer must be able to verify the effects of different types of voltage sags on its machines in order to guarantee compliance with the different standards. This invention proposes a solution to this problem.

DESCRIPTION OF THE INVENTION

The subject of this invention is a device for testing, at low and medium voltage, the behavior of an electrical generator machine such as a wind turbine in response to a voltage sag similar to one which may occur on the network to which it is connected, with the wind turbine connected to the network.

The device comprises:
- between one and three transformers in parallel that are connected on one side to the wind turbine by means of coupling switch and isolator switch associated with each of the transformers respectively, and which are connected on the other side to ground by means of circuit breakers associated with each of the transformers respectively and a control switch;
- mechanisms for generating short circuits by activating the coupling switch and the control switch in a manner which controls their aperture and closure time instances in order to generate a voltage sag of a duration in line with that required, and by activating the circuit breakers in order to select the number of transformers involved in the generation of the voltage sag, when there is more than one transformer, and to select the single phase, two phase or three phase type of the sag; and
- mechanisms for the protection of the transformers during voltage sag generation and, preferably one or various of the following:
  - choke coils to eliminate the high frequency waves which may affect the transformers when the voltage sag is produced;
  - a three phase earthing reactor; and
  - automatic valves to eliminate possible overvoltages on the transformers.

This device is capable of producing single phase, two phase and three phase short circuits, with or without ground, on a wind turbine connected to the network by means of the voltage divider formed by the transformers, in order to allow the aforementioned wind turbine to be tested against the different voltage sags which can be produced without requiring the wind turbine to be removed from the wind park.

Specifically, the device enables:
- different types of voltage sags to be generated on terminals of the wind turbine by creating actual short circuits of a determined duration;
- the short circuit power to be reduced at the point at which it is generated, for the purpose of ensuring minimal disturbance to the rest of the network;
- the wind turbine to be operated at full power.

The device of this invention can be coupled:
- To the low voltage of the wind turbine, when the wind turbine's transformer is located in the lower part of the tower, with the low voltage of the wind turbine accessible for device connection;
- To the medium voltage of the wind turbine, when the wind turbine's transformer is located in the upper part of the tower, with the medium voltage being the most accessible voltage for device connection;

The device described can be used for testing wind turbines of any power level, given that it is based on using equipment that is the same as the equipment of the wind turbine. It has been successfully used for testing 850 kW and 2 MW wind turbines.

Other characteristics and advantages of this invention become apparent from the detailed description and the accompanying figures that follow.

DETAILED DESCRIPTION OF THE INVENTION

Figure 1:
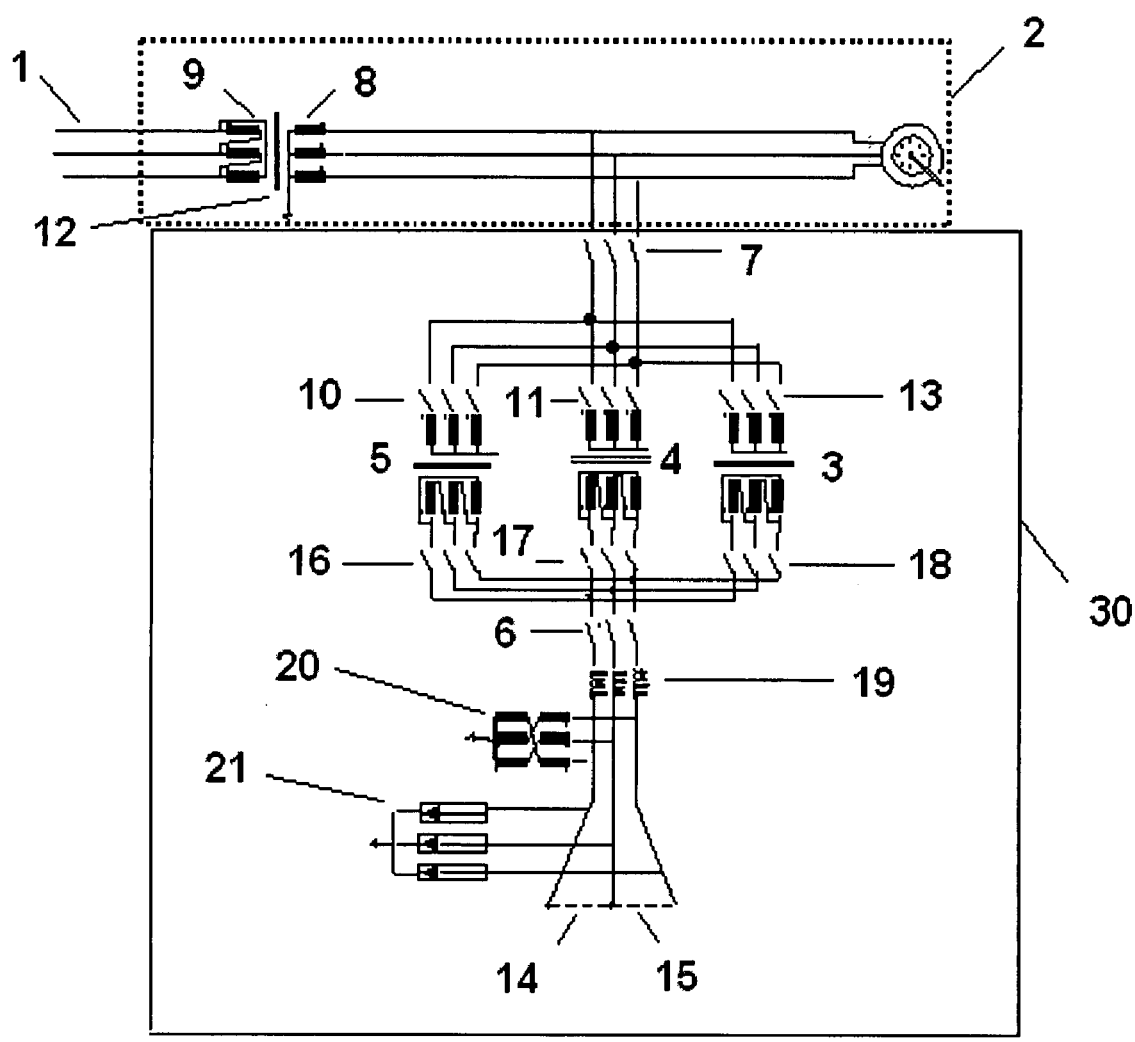
FIG. 1 shows a layout of the invention device, in its low voltage assembly.

The device 30 according to this invention is capable of generating voltage sags on a wind turbine 2 connected to the medium voltage network (MV) 1 by means of a structure basically comprised of three transformers 3, 4 and 5, arranged in parallel, connected by means of circuit breakers 13 and 18, 11 and 17, and 10 and 16 respectively, to the coupling switch 7, to the wind turbine and to the control switch 6, it is in turn equipped with the necessary operation and control elements, for the purpose of creating short circuits of different durations and types (single phase, two phase or three phase, with or without ground), creating waveforms on terminals of the wind turbine 2 similar to those which appear in cases where a voltage sag has occurred on the network MV 1.

Figure 2:
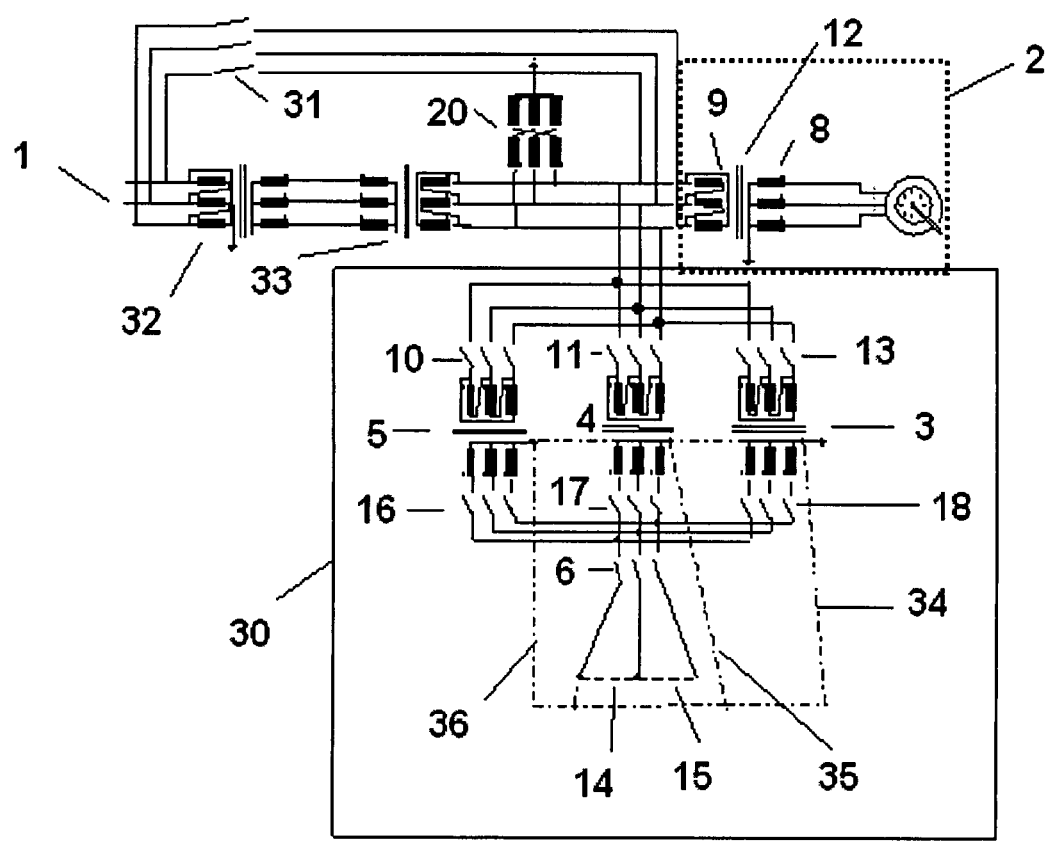
FIG. 2 shows a layout of the invention device, in its medium voltage assembly.

The invention device 30 includes two assembly types:
assembly on the low voltage 8 of the wind turbine 2, when the transformer 12 of the wind turbine 2 is located on the lower part of the tower of the same, with the low voltage side 8 of the wind turbine 2 accessible for connecting said device 30 (FIG. 1);
assembly on the medium voltage side 9 of the wind turbine 2, when the transformer 12 of the same is located on the upper part of the tower, with the medium voltage side 9 being the most accessible for connecting the invention device 30 (FIG. 2);

Low Voltage Assembly (LV)

In a first embodiment of the invention, when the transformer 12 of the wind turbine 2 is located on the lower part of the tower of the same, the device 30 is installed on the low voltage side 8 as shown in FIG. 1, being connected by means of an automatic switch 7, which serves to couple and uncouple the device 30 to and from the wind turbine 2 and to define the duration of the voltage sag, whilst also functioning as an additional protection element for said device 30, supporting a maximum effective short circuit current which ranges between 0.5 Icc (with one transformer) and 0.75 Icc (with three), with Icc being the nominal short circuit intensity on the low voltage of the wind turbine. The wiring must therefore support said intensities, which depending on the power of the wind turbine can be thousands of amperes.

The device 30 mainly comprises three transformers 3, 4 and 5, identical to the transformer of the wind turbine itself, which are connected or disconnected by means of the circuit breakers 10, 11, 13, 16, 17 and 18, depending on the range of voltage sag amplitudes that are required. Equally, the device 30 allows three phase or two phase voltage sags to be generated on the wind turbine 2 by means of lines 14 and 15, which close or do not close the transformers 3, 4 and 5 by means of the control switch 6, so that when the generation of a three phase voltage sag is required, lines 14 and 15 are closed, and when the generation of a two phase voltage sag is required, only line 14 is closed. The aforementioned lines 14 and 15 support fairly low effective short circuit currents, in accordance with the transforming ratio of the transformers used.

The invention device 30 also comprises the following additional elements:
choke coils 19, preferably with an impedance value of 0.2 mH, for eliminating the high frequency waves which could affect the transformers 3, 4, 5 when a voltage sag is produced;
a three phase earthing reactor 20, preferably in zigzag, as a protection element; and
automatic valves 21 of a correct voltage for the medium voltage of the wind farm, in order to eliminate possible overvoltages in the transformers 3, 4, 5.

The operation method for the device 30 comprises the following steps:
closure of the coupling switch 7;
successive closure of the circuit breakers 13, 11 and 10 in order to energise transformers 3, 4 and 5, respectively;
voltage sag generation by means of:
the remote closure of the control switch 6, which would cause the sag to begin;
the timed aperture of the coupling switch 7 with a programmable delay in relation to the closure of the control switch 6, which would cause the end of the voltage sag; this delay, which could range between 100 msec and various seconds, will depend on the depth and duration of the sag that is required (this will depend on the standards to be complied with: A typical value would be 500 mseg);
the timed aperture of the control switch 6, preferably with a 100 msec delay in relation to the aperture of the switch 7.

Grounding the low voltage winding neutrals of transformers 3, 4, 5 must be avoided in order to prevent an increase in the level of short circuit power in a possible ground fault on the LV side 8.

Medium Voltage Assembly (MV)

According to a second embodiment of the invention, when the transformer 12 of the wind turbine 2 is located on the upper part of the tower of the same, the device 30 for generating voltage sags is connected to the MV side 1. In this case, as shown in FIG. 2, a three phase earthing reactor 20 needs to be inserted, preferably in zigzag, in parallel with the medium voltage of the wind turbine 2, two transformers 32 and 33, preferably the same as the transformer 12 of the wind turbine 2 itself, of the wye-delta type and with the neutral of the low voltage side of one of them grounded, as well as a three phase by-pass 31, so that voltage sag tests can be performed with the device 30 without affecting the operation of the wind turbine 2 for the rest of the time.

In this assembly, at least one of the three transformers of the device 30 must be of a lower power than the main transformers, preferably half the power, if a wide range of voltage sags is to be achieved.

In addition to the aforementioned elements described in the first embodiment, the device 30 also includes lines 34, 35 and 36 which, together with lines 14 and 15, close transformers 3, 4 and 5, producing different types of voltage sags in the following manner:
if the sag to be generated is a three phase type sag, the device 30 closes 14 and 15;
if the sag to be generated is a two phase type sag, the device 30 closes only 14;
if the sag required is the two phase to neutral type (ground), the device 30 closes 14 and 34, if there is one neutral, 14, 34 and 35 are closed for two neutrals and 14, 34, 35 and 36 are closed for three neutrals;
if the sag required is the single phase to neutral type (ground), the device 30 closes 34 if there is one neutral, 34 and 35 are closed for two neutrals and 34, 35 and 36 are closed for three neutrals;

For both assemblies, both LV and MV, the magnitude of the voltage sag produced by the device 30 varies according to the size of the wind farm and the configuration of the device 30 used to produce said voltage sag, therefore the magnitude of the voltage sag produced by three phase faults (supposing the three transformers of the device are half the power) will be:
approximately 50%, with one transformer 5,
approximately 66%, with two transformers 4 and 5, and
approximately 75%, with three transformers 4, 5 and 6.

The short circuit currents that can be expected will be the same as those which appear on the LV connection layout.

The magnitude of the voltage sag will depend on the contribution made by the wind turbine 2 to the fault, although the aforementioned values relate to tests on double feed wind turbines 2, where the contribution of the same decreases quickly.

In the case of asymmetric faults, the sag will depend on the configuration used, with a wide range of sags able to be obtained in both cases.

In the preferred embodiments described above, modifications within the scope of the following claims may be made.

The invention claimed is:

1. A device for generating voltage sags on an electrical generator machine connected to an electrical network, comprising:
   a) between one and three transformers arranged in parallel and connected on one side to the electrical generator machine by means of a coupling switch and circuit breakers associated with each of the transformers respectively, and which are connected on the other side to ground by means of circuit breakers associated with each of the transformers respectively and a control switch;
   b) mechanisms for generating short circuits by activating the coupling switch and the control switch in a manner which controls their aperture and closure time instances in order to generate a voltage sag of a duration in line with that required, and by activating the circuit breakers in order to select a number of transformers involved in generating the voltage sag, when there is more than one transformer, and to select a single phase, two phase, or three phase type of the sag; and
   c) mechanisms for protecting the transformers during voltage sag generation.

2. The device for generating voltage sags in accordance with claim 1, wherein the mechanisms for protecting the transformers comprise one or more of the following:
   a) choke coils to eliminate high frequency waves which may affect the transformers when the voltage sag is produced;
   b) a three phase earthing reactor; and
   c) automatic valves to eliminate possible overvoltages on the transformers.

3. The device for generating voltage sags in accordance with claim 1, wherein the electrical generation machine is a wind turbine.

4. The device for generating voltage sags in accordance with claim 3, wherein the device is assembled on a low voltage side of the wind turbine.

5. The device for generating voltage sags in accordance with claim 3, wherein the device is assembled on a medium voltage side of the wind turbine and further comprises two additional transformers and a three phase by-pass so that its operation is not affected when a voltage sag is generated.

6. The device for generating voltage sags in accordance with claim 5, wherein if there are various transformers, at least one of them must be of a lower power level than the rest.

7. The device for generating voltage sags according to claim 4, wherein a majority of the transformers are identical to the transformer of the wind turbine.

8. The device for generating voltage sags according to claim 6, wherein a majority of the transformers are identical to the transformer of the wind turbine.

* * * * *